United States Patent
Pang

(10) Patent No.: US 7,791,185 B2
(45) Date of Patent: Sep. 7, 2010

(54) PIN GRID ARRAY PACKAGE SUBSTRATE INCLUDING PINS HAVING CURVED PIN HEADS

(75) Inventor: Mengzhi Pang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 321 days.

(21) Appl. No.: 11/758,401

(22) Filed: Jun. 5, 2007

(65) Prior Publication Data
US 2008/0303135 A1 Dec. 11, 2008

(51) Int. Cl.
*H01L 23/48* (2006.01)
(52) U.S. Cl. .............. 257/697; 257/738; 257/772; 257/773; 257/779; 257/E23.033; 361/791; 439/45; 439/46; 439/47; 439/935
(58) Field of Classification Search ................ 257/697, 257/772, 779, 737, 738; 361/791; 439/45–47, 439/75, 823, 935; 174/267; 228/180.22
See application file for complete search history.

(56) References Cited

U.S. PATENT DOCUMENTS 7,388,296 B2 * 6/2008 Urashima et al. ........... 257/779

FOREIGN PATENT DOCUMENTS

JP 63-157455 * 6/1988

* cited by examiner

*Primary Examiner*—Jasmine J Clark
(74) *Attorney, Agent, or Firm*—Blakely, Sokoloff, Taylor & Zafman LLP

(57) ABSTRACT

An electrically conductive pin comprising a pin stem and a pin head attached to the pin stem. The pin head is adapted to be mounted onto a surface of a microelectronic substrate to support the pin stem. The pin head has an underside surface defining a continuous curve configured to allow gases to escape from a pin-attach solder region adjacent the underside surface.

5 Claims, 3 Drawing Sheets

PIN GRID ARRAY PACKAGE SUBSTRATE INCLUDING PINS HAVING CURVED PIN HEADS

FIELD

Embodiments of the present invention relate generally to pin grid array package substrate configurations.

BACKGROUND

Pin grid array (PGA) packages are well known in the art. During flip chip attach of a microelectronic die to a substrate including a PGA thereon, a reflow process typically occurs at high temperatures, such as, for example, at about 230 degrees Celsius to join solder bumps on the PGA substrate to conductive bumps, typically Cu bumps, on the die. The reflow process softens and melts not only the solder bumps on the PGA substrate, but also the solder, such as SnSb (sometimes alloyed with Au from the substrate lands), that is typically used to attach the pins of the PGA to lands on the package substrate (hereinafter "pin-attach solder"). In addition to a softening of the pin-attach solder reflow of the solder bumps on the PGA substrate volatile material trapped in the pin-attach solder tends to vaporize and, along with any air voids trapped in the pin-attach solder, try to escape from the same. A softening of the pin-attach solder and movement of the vaporized volatile material and air voids therein during reflow contribute to lift and pin and cause a tilting of the pins supported by the pin-attach solder. The above problem is exacerbated as pins are getting smaller and therefore lighter, and as pin count/pin density increases.

The above problem is exacerbated by the use of lead free C4 solder metallurgy and NiPdAu surface finishing. Specifically speaking, the increase of the melting point of lead-free SnAg solder over eutectic SnPb requires the peak temperature of a typical die attachment process to be about 230 degrees Celsius, which overlaps the melting range of the pin attach solder SnSb. As a result, a softening of the SnPb occurs, which may result in up to about 20% pin tilt failure of assembled packages. A second aspect of the problem is that, as compared with a pairing of SnSb with ENIG, SnSb displays poorer wetting interaction with NiPdAu, which may result in more solder voiding entrapment under the pins. Limited x-sectional observation shows about 30% of pins in such a situation as having voids greater than 200 microns. The presence of such large voids can also result in mechanically weak PGA joints as well as in pin movement.

FIG. 1 shows a PGA joint formed according to the prior art. In FIG. 1, a side view is shown of one of a pin 1 in a tilted state after C4 bumping. The pin 1 is shown as being mounted onto substrate 5. Pin 1 includes a pin stem 2 and a pin head 4 attached to the pin stem. The pin head 4 is shown as being mounted onto a land pad 8 on a PCB-side surface 6 of substrate 5 using a pin-attach solder joint 10 as shown. As seen in FIG. 1, the pin-attach solder joint 10 includes voids therein which have tilted the pin 1 for the reasons explained above, thus weakening the electrical and mechanical bond between pin 1 and land pad 8.

The prior art attempts to address the problem of pin tilt include reducing the reflow temperature in order to control a softening of the pin-attach solder and a movement of vaporized volatile material therein. Doing so has shown to improve pin tilt yields, but, disadvantageously, requires very accurate control of the C4 die attach process, even during high volume manufacturing, and further increases the risk for non wets/ de-wets on the die to substrate interconnection. The above method may cause insufficient solder joint strength and more void entrapment during C4 die attach simply because a lower peak temperature can jeopardize the processing window for C4 attachment.

The prior art fails to provide an effective method of minimizing pin tilt during flip chip attach of a die to a PGA substrate.

Figure 1:
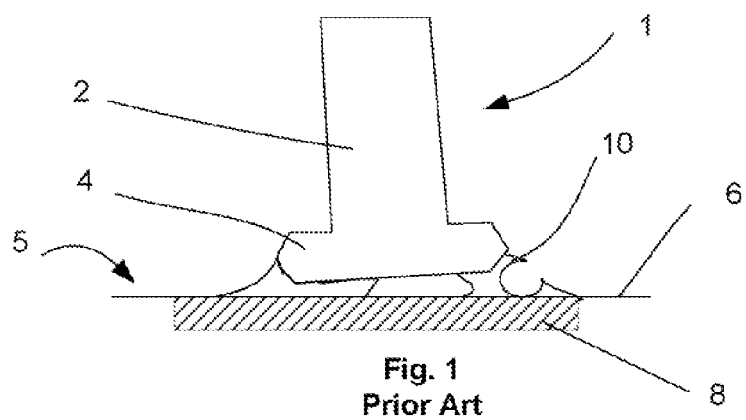
FIG. 1 is a schematic side view of a prior art PGA joint including a tilted conductive pin.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic package, a solder alloy used to form the package, a method to make the solder alloy, and a system including the package are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that Fig. X shows element A and Fig. Y shows element B. In addition, a "layer" as used herein may refer to a layer made of a single material, a layer made of a mixture of different components, a layer made of various sub-layers, each sub-layer also having the same definition of layer as set forth above.

Aspects of this and other embodiments will be discussed herein with respect to FIGS. 2, 3a-3d and 4 below. The figures, however, should not be taken to be limiting, as it is intended for the purpose of explanation and understanding.

Figure 2:
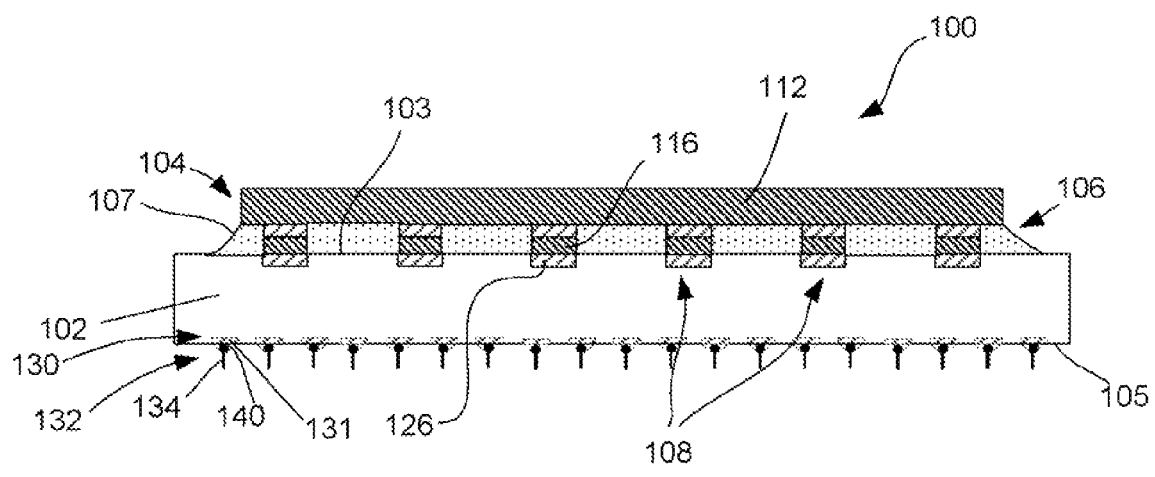
FIG. 2 is a schematic, side-cross sectional view of a microelectronic package according to embodiments.

Referring first to FIG. 2, a microelectronic package 100 is shown according to one embodiment. Package 100 includes a package substrate 102, and a die 104 bonded to the substrate by a bond 106. The substrate 102 includes a die-side surface 103 which is adapted to receive die 104 thereon, such as by including under-bump metallization or UBM in the form of lands 126. The substrate 102 further includes a PCB-side surface 105 adapted to electrically and mechanically couple the package 100 to a printed circuit board or PCB in a well known manner. As seen in FIG. 2, a plurality of joint structures 108 are shown between the die 104 and the substrate 102, the joint structures 108 forming at least part of bond 106. Optionally, the bond 106 may also include an underfill material 107 provided in a well known manner. Substrate 102 further includes an array 130 of land pads 131 on the PCB-side surface 105 of substrate 102. By "land pad," what is meant in the context of the instant application is a site on a substrate, such as a package substrate, adapted to allow an electrical and mechanical joining of the substrate with another microelectronic component, such as through a solder connection or through a PGA. The substrate 102 as shown includes a PGA substrate, and thus comprises an array 132 of electrically conductive pins 134 electrically and mechanically bonded to respective ones of the land pads 131. As seen in the embodiments of FIG. 2, and as will be explained in further detail with respect to the embodiments of FIGS. 3*a*-3*d*, the pin heads have an underside surface defining an continuous curve configured to allow gases to escape from the pin attach solder 140 adjacent the underside surface during C4 die attach.

Referring now to the embodiments of FIGS. 3*a*-3*d*, a side cross-sectional view is shown of a PGA joint including one of the pins 134 of FIG. 2 in a state where the pin 134 is shown as being mounted onto substrate 102. According to embodiments, as shown by way of example in FIGS. 3*a*-3*b*, a pin 134 of the array 132 (FIG. 2) includes a pin stem 136 and a pin head 138 attached to the pin stem. In the shown embodiment, the pin stem 136 extends in a substantially perpendicular direction with respect to the pin head 138. Each pin head 138 is shown as being mounted onto a corresponding land pad 131 of the array 130 onto the PCB-side surface 105 of substrate 102 using a pin-attach solder joint 140 as shown. As seen in FIGS. 3*a*-3*d*, the pin-attach solder joint 140 electrically and mechanically bonds an underside 142 of pin head 138 to the PCB-side surface 105.

Referring still to FIGS. 3*a*-3*d*, various embodiments are shown for the shape of a pin head. According to embodiments, as depicted in exemplary fashion in FIGS. 3*a*-3*d*, a pin head has an underside surface which defines a continuous curve configured to allow gases to escape from a pin attach solder region adjacent the underside surface. By "underside surface" of the pin head, what is meant in the context of embodiments is a surface of the pin head extending in a direction that has a component adapted to extend parallel to a surface of the land pad of the substrate to which the pin head is to be attached. By "continuous curve," what is meant to be conveyed in the context of the instant description is that the underside surface of the pin head defines a single curve (that is, a curve without interruptions) in any cross-sectional plane extending through the underside surface at a scale represented by the dimensions of the pin head. Although a "curve" is generally known to be defined among others by its continuity, the expression of "continuous curve" is being used herein to distinguish with respect to a number of curves connected by discontinuities or corners at a scale represented by the dimensions of the pin head. A pin head according to embodiments allows "gases to escape from pin-attach solder region" as noted above when the pin head is shaped such that any volatilized materials in the pin attach solder, or any air voids in the pin attach solder, can escape from the pin attach solder region adjacent the underside surface.

Figure 3A:
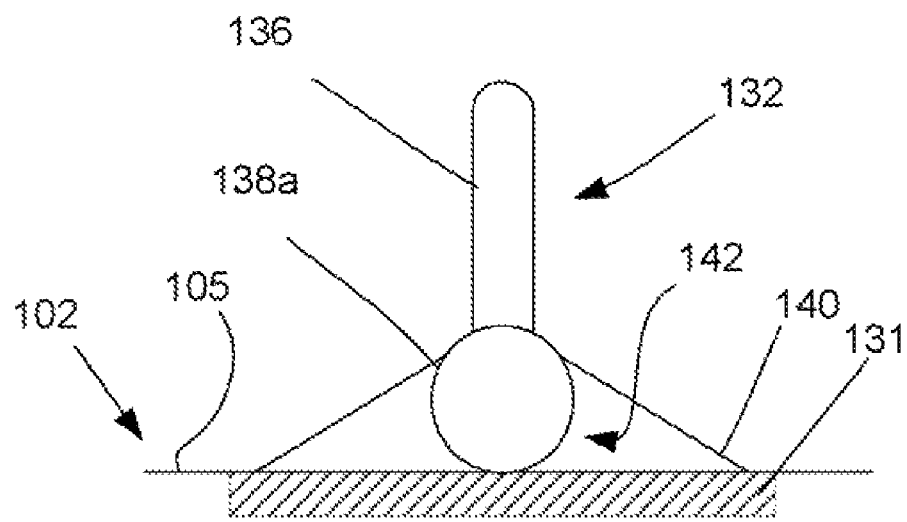
FIGS. 3a-3d are schematic side-cross sectional views PGA joints such as those shown in FIG. 2 according to four respective embodiments.
Figure 3B:
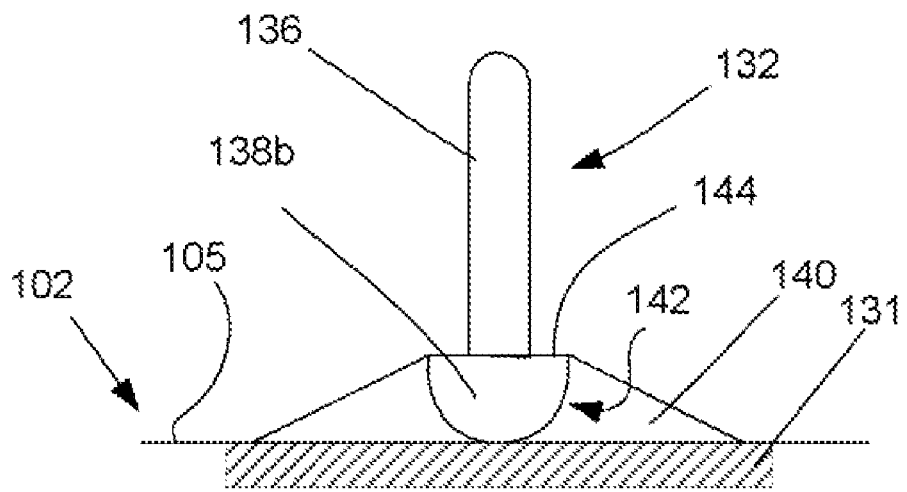
Figure 3C:
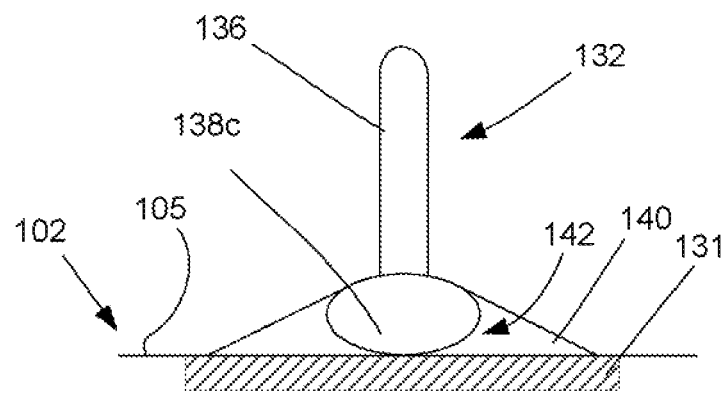
Figure 3D:
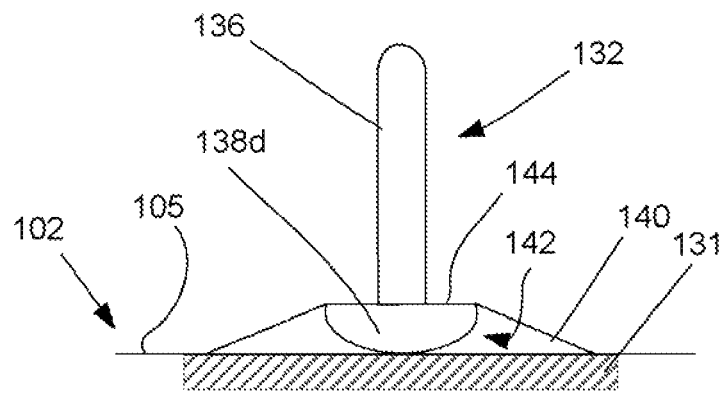

FIGS. 3*a*-3*d* respectively show pin heads 138*a*, 138*b*, 138*c* and 138*d* according to respective embodiments. As shown in the embodiments of FIGS. 3*a* and 3*b*, the underside surface 142 may be spherically shaped, that is, it may define a partial surface of a sphere. As shown in the embodiments of FIGS. 3*c* and 3*d*, the underside surface 142 may be elliptically shaped, that is, it may define a partial surface of an elliptical volume. As seen in FIG. 3*a*, the pin head 138*a* may comprise a spherical volume. As further seen in FIG. 3*c*, the pin head 138*c* may comprise an elliptical volume. When, according to the instant description, the pin head is described as comprising either a spherical or an elliptical volume, what is meant is that the pin head includes a spherically or elliptically shaped surface that is not limited to the pin head's underside surface. For example, a pin head according to embodiments may include either a sphere as shown in FIG. 3*a*, or a complete elliptical volume (i.e. not a partial ellipse) as shown in FIG. 3*c*. As further seen in FIGS. 3*b* and 3*d*, the spherical or elliptical shape of the underside surface 142 may not extend beyond the underside surface 142. Furthermore, as seen in the shown embodiments, a pin head may include a flat pin-stem-side surface 144, such as one which is adapted to receive the pin stem 136 thereon. Preferably, when the underside surface is elliptically shaped, the underside surface is oriented such that a major axis thereof is coextensive with a longitudinal axis of the spin stem, in this way facilitating an escape of gases from the pin-attach solder during the C4 attach reflow process.

Embodiments are not limited, however, to an underside surface which is either spherically or elliptically shaped. Rather, embodiments comprise within their scope any continuously curved underside surface shaped to allow gases to escape from the pin attach solder region adjacent thereto. In addition, although the shown embodiments depict the pin head as contacting the land pads, embodiments are not so limited, and include within their scope a pin head adapted to extend only partially through the pin attach solder.

Advantageously, the provision of a continuously curved underside surface for a pin head according to embodiments, such as pin heads 138*a*-138*d* shown in FIGS. 3*a*-3*d*, allows solder voids and flux volatiles to escape during high temperature reflow processes to attach a die to the package substrate, and in this way substantially prevent pin tilt. Additionally, advantageously, a continuously curved underside surface of a pin head according to embodiments allows increased surface area for the pin-attach solder to wet the pin, and in this way allow for the formation of a robust pin-attach solder joint. Moreover, a continuously curved underside surface advantageously allows for volatiles and trapped air voids to escape from an underside of the pin during pin attach to substrate lands, in this way bringing about a pin-attach solder joint including fewer voids under the pin and hence improved pin pull strength performance. Furthermore, a continuously curved underside surface of a pin head according to embodiments advantageously allows any volatiles and/or trapped voids still under the pin head to escape during reflow/die attach without causing the pin to tilt. Moreover, embodiments enable finer pitch PGA technology for future platforms, since, given the same contact area between pin attach solder and pin head, a continuously curved underside surface of a pin head has much less lateral dimension compared to its flat counterpart. A more robust bonding quality, including less voids and more bonding area of the pin head with the substrate land, advantageously tends to restrict an effect of pin attach solder softening on a movement of the pin during C4 attach reflow. In addition, a geometry of inserting the pin head shaped according to embodiments may act to mechanically lock a random movement of the pin, as there is less solder volume (especially solder with voiding) present under the pin.

Figure 4:
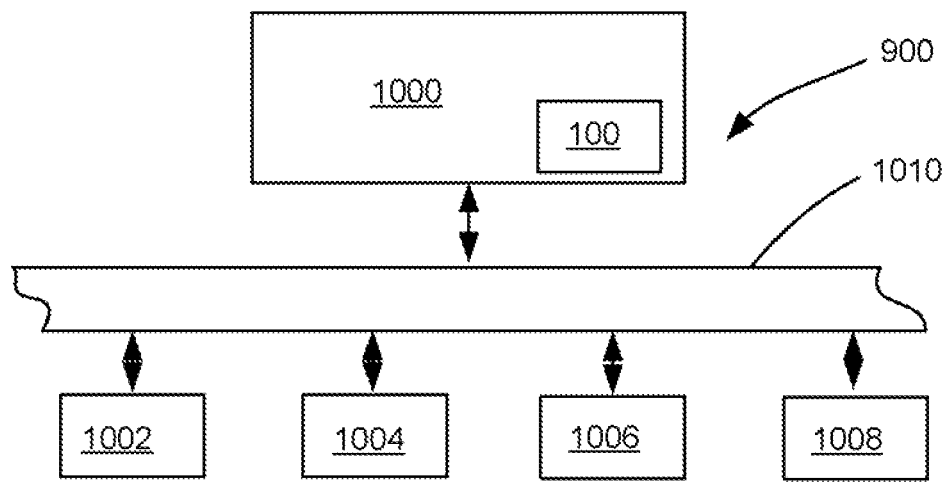
FIG. 4 is a schematic view of an embodiment of a system incorporating a microelectronic package as shown in FIG. 2.

Referring to FIG. 4, there is illustrated one of many possible systems 900 in which embodiments of the present invention may be used. In one embodiment, the electronic assembly 1000 may include a microelectronic package, such as package 100 of FIG. 2. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 4, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A microelectronic package substrate comprising:
   a die-side surface adapted to receive a die thereon;
   a PCB-side surface adapted to be mechanically and electrically bonded to a PCB;
   an array of land pads on the PCB-side surface;
   an array of electrically conductive pins electrically and mechanically bonded to respective ones of the land pads, each of the pins having a pin stem and a pin head attached to the pin stems the pin head being mounted onto a corresponding land pad, at least some pin heads having a shape selected from the group consisting of a spherical volume and an elliptical volume; and
   a plurality of pin-attach solder joints mechanically and electrically bonding the pins to corresponding ones of the land pads.

2. The substrate of claim 1, wherein the at least some pin heads include flat pin-stem-side surfaces.

3. The substrate of claim 1, wherein the underside surface is oriented such that a major axis thereof is coextensive with a longitudinal axis of the pin stem.

4. An electrically conductive pin comprising:
   a pin stem; and
   a pin head attached to the pin stem, the pin head being adapted to be mounted by way of pin-attach solder onto a surface of a microelectronic substrate to support the pin stem said pin head having a shape selected from a spherical volume and an elliptical volume, the pin head having an underside surface defining a continuous curve configured to allow gases to escape from the pin-attach solder adjacent the underside surface.

5. The pin of claim 4, wherein the underside surface is oriented such that a major axis thereof is coextensive with a longitudinal axis of the pin stern.

* * * * *